(12) United States Patent
Poletti

(10) Patent No.: US 7,206,419 B1
(45) Date of Patent: Apr. 17, 2007

(54) GUITAR PREAMLIFIER SYSTEM WITH CONTROLLABLE DISTORTION

(75) Inventor: Mark Alistair Poletti, Wellington (NZ)

(73) Assignee: Industrial Research Limited, Lower Hutt (NZ)

( * ) Notice: Subject to any disclaimer, the term of this patent is extended or adjusted under 35 U.S.C. 154(b) by 0 days.

(21) Appl. No.: 09/197,096

(22) Filed: Nov. 20, 1998

(30) Foreign Application Priority Data

Nov. 20, 1997 (NZ) ..................................... 329119

(51) Int. Cl.
*G06F 19/00* (2006.01)
(52) U.S. Cl. .......................................... 381/98; 84/625
(58) Field of Classification Search .................. 84/625, 84/660–661, 697, 699–700; 381/61–63, 381/66, 118–120, 97–100, 17, 18, 94.3; 704/226–228, 704/233, 500–504, 205, 207
See application file for complete search history.

(56) References Cited

U.S. PATENT DOCUMENTS

| | | | | |
|---|---|---|---|---|
| 4,069,732 A | * | 1/1978 | Moskowitz et al. ........... | 84/727 |
| 4,357,852 A | * | 11/1982 | Suenaga ...................... | 84/1.16 |
| 4,412,100 A | | 10/1983 | Orban .......................... | 381/100 |
| 4,495,640 A | * | 1/1985 | Frey ............................. | 381/61 |
| 4,538,495 A | * | 9/1985 | Sato ............................. | 84/622 |
| 4,584,700 A | * | 4/1986 | Scholz ......................... | 381/61 |
| 4,589,135 A | * | 5/1986 | Baker .......................... | 381/100 |
| 4,890,331 A | * | 12/1989 | Brown, Sr. et al. ......... | 381/120 |
| 4,901,618 A | * | 2/1990 | Blum, Jr. .................... | 84/453 |
| 5,023,915 A | * | 6/1991 | Brown, Sr. et al. ......... | 381/120 |
| 5,060,273 A | * | 10/1991 | Olah et al. ................... | 381/119 |
| 5,133,015 A | * | 7/1992 | Scholz ......................... | 381/61 |
| 5,317,104 A | * | 5/1994 | Frost ............................ | 84/625 |
| 5,789,689 A | | 8/1998 | Doidic et al. ................ | 84/603 |
| 5,841,875 A | * | 11/1998 | Kuroki et al. ................ | 381/61 |
| 5,848,164 A | * | 12/1998 | Levine ......................... | 381/61 |
| 5,892,833 A | * | 4/1999 | Maag et al. .................. | 381/98 |
| 6,111,960 A | * | 8/2000 | Aarts et al. .................. | 381/61 |

FOREIGN PATENT DOCUMENTS

| JP | 404142598 A | * | 5/1992 | .................. 84/625 |
|---|---|---|---|---|
| WO | WO 98/23131 | * | 5/1998 | |

OTHER PUBLICATIONS

Anderton, Craig, "Build the Super-Versatile Quadrafuzz—Four Fuzzes in One with Active EQ," *Guitar Player Magazine*, pp. 37-46, Jun. 1984.
Coughlin, Robert F. and Driscoll, Frederick F., *Operational Amplifiers and Linear Integrated Circuits*, 4th Ed., Prentice Hall: New Jersey, pp. 304-305, 1991.
"Floobydust," *Audio/Radio Handbook*, Martin Giles ed., National Semiconductor Corp.: California, pp. 5-1-5-7, 1980.

* cited by examiner

*Primary Examiner*—Vivian Chin
*Assistant Examiner*—Lun-See Lao
(74) *Attorney, Agent, or Firm*—Stacy L. Blasberg; Choate Hall & Stewart LLP

(57) ABSTRACT

A musical instrument preamplifier system is provided which comprises a filtering means for splitting an input signal into two or more separate frequency bands comprising a similar phase response for each frequency band, two or more non-linear circuits, each of which distorts the input signal component of one of the frequency bands, and a summing network for recombining said frequency bands.

13 Claims, 10 Drawing Sheets

GUITAR PREAMLIFIER SYSTEM WITH CONTROLLABLE DISTORTION

FIELD OF INVENTION

The present invention comprises an improved preamplifier system.

BACKGROUND OF INVENTION

The sound produced by the electric guitar is strongly dependent on the guitar amplifier. All guitar amplifiers contain a preamplifier, which may have a frequency dependent input stage (for example the 'bright' input on some amplifiers), one or more distortion stages, and a tone control stage. The preamplifier output is fed to the power amplifier section. The power amplifier generates the signal required to drive the speaker, and may also operate in a nonlinear fashion at high levels. The amplifier output is fed to a loudspeaker, which converts the amplified signal into an acoustic signal. The loudspeaker may also operate in a nonlinear fashion.

The guitar amplifier thus has the role of altering the guitar signal by linear filtering, and nonlinear distortion, which is the reason why it is so critical to the guitar sound. The nature of the nonlinear mechanisms in the amplifier and their relationship to the linear elements are what determines the sounds that are recognised as being associated with each musical genre (rock, blues, etc).

The guitar amplifier has been in existence for over forty years, and the range of products available today is more diversified than it has ever been. Both solid state and valve (tube) amplifiers are available, both in combo and discrete form. In addition, a plethora of discrete guitar preamplifiers are available which seek to mimic the sound produced by the guitar amplifier at controllable volumes, and which can be input to mixing desks for recording purposes, or which are input directly to power amplifiers with either hi fidelity PA speakers, or guitar speaker cabinets.

In spite of the years of development since the early amplifiers, the original technology still maintains a pre-eminent position in the marketplace. The valve amplifier is still preferred by many musicians, and the speakers used are practically identical to those of the original amplifiers. Early tube amplifiers were relatively simple, and had high distortion figures, and when overdriven produced a sound that was perceived as musical. When solid state (semiconductor) amplifiers appeared on the market, they were expected to be an improvement over valve technology. Both the musicians did not agree. For example, Jimi Hendrix used solid state amplifiers for a time, but returned to valve amplifiers because he preferred their sound. Valve amplifiers have since come to be regarded as better sounding, although solid state amplifiers have been further developed and now produce more reasonable imitations.

Many opinions have been expressed as to why valve amplifiers sound better than solid state amplifiers, but few of these opinions have been backed up by scientific evidence, and few of them take into account all of the characteristics of the valve amplifier that could contribute to its preferred status. Some of the characteristics that differentiate valve and solid state amplifiers, and the effect of the loudspeaker (which is common to both) are mentioned below by way of background.

Nonlinear and overload characteristics of valve and semiconductor devices: A common belief is that valves have a soft clipping characteristic which does not produce sharp discontinuities in the signal waveform, and avoids the production of high harmonics. However, it is simple to construct solid state nonlinear circuits with compression characteristics that are even softer than those of valves, but which do not produce the same results subjectively.

Another popular opinion is that valves produce even order distortion products, whereas solid state amplifiers produce odd order harmonics. However, the truth of this statement is dependent on the circuit topology and the degree of overdrive. In a preamplifier stage, the valve/transistor is operated in a class A mode, and both devices produce even and odd order distortion. However, the valve will produce a different set of harmonics to the transistor. Hamm, has demonstrated, for example, that valves have harmonic 'signatures' which are different to those of transistors, and in many cases the valve produces less high harmonics than the transistor (see R. O. Hamm, "Tubes versus Transistors—Is There An Audible Difference?" J. Audio Eng. Soc., vol. 21, no. 4, pp 267–273, May 1973). The harmonic signature of the valve is more closely matched by that of the field effect transistor, which has a quadratic relationship between the drain current and gate voltage, similar to the plate current verses grid voltage characteristic of a valve.

When a preamplifier valve is serverly overloaded, the gate voltage can exceed the cathode voltage. In this case conduction occurs between the gate and cathode, and the positive peaks of the applied input waveform are clipped. It is claimed that this produces a bias shift in the waveform, and that this creates a significant amount of second harmonic distortion (see European patent application 95300062.7, "Multi-stage solid state amplifier that emulates tube distortion", Peavey Electronics Corp.). A multi-stage preamp with several valves creates a high level of distortion, clipping and sustain that is recognised as having a tube preamplifier distortion characteristic.

A number of different solid state devices have been used to attempt to create subjectively acceptable distortion. Germanium and silicon transistors were used in early fuzz box products. Diode clippers have been employed. Diodes in the feedback loop of an operational amplifier create a softer clipping characteristic because the gain of the op amp reduces as the diode starts to conduct. Light emitting diodes have also been employed in this manner. Transistors can be employed in the same way to allow voltage control of the transfer characteristic. Even CMOS inverters have been biased to create nonlinear amplifier stages.

In a power amplifier, two output power devices are typically operated in class B or AB mode. This produces a transfer characteristic which is symmetrical, and as a result, the circuit produces only odd order harmonics, whether it is a valve stage or transistor stage. However, when the power amplifier is severely overloaded, the output waveform is more dependent on the device characteristics. Grid conduction and bias shift occurs in a valve power stage, creating an output waveform which demonstrates crossover distortion, and this waveform is claimed to be subjectively superior to that of the solid state waveform (see European patent application 95300126.0, "Solid state tube compression circuit", Peavey Electronics Corp.).

The output transformer: The operating characteristics of valves require that an output transformer be used to match them to low impedance speaker loads. However, practical transformers have leakage inductances and inter-winding capacitances which limit their performance. There are a number of consequences of this fact. Firstly, high levels of negative feedback cannot be applied to the valve amplifier, because the transformer response at high frequencies is likely to cause instability. This means that valve amplifiers have lower levels of global negative feedback than solid state amplifiers, and higher distortion figures.

A second consequence is that the transformer does not have a flat response, and therefore contributes some filtering to the distorted signal from the power amplifier stage, particularly with low negative feedback.

A third consequence is that iron cored transformers are nonlinear. The magnetizing current in the primary coil is a nonlinear function of the applied voltage, and unless the source has a low impedance, this magnetizing current produces distortion in the output waveform (see N. G. R. Partridge, "Harmonic Distortion in Audio Frequency Transformers," Wireless Engineering, p 394, September 1942; p 451, October 1942, p 503 November 1942). This form of distortion can occur in pentode output stages due to the high output impedance of the pentode.

Power Supplies: Valve power supplies tend to have poorer regulation than solid state supplies, and the plate voltage can fall when the output sate of a valve amplifier overloads, producing a greater degree of compression of the signal.

Output impedance: The interaction between the amplifier and speaker differs between valve and solid state devices, due to their different output impedances. A low output impedance solid state amplifier is better able to control the loudspeaker motion, whereas the higher output impedance valve amplifier allows the natural response of the speaker to be more perceptible. This is most noticeable at the low frequency resonance of the speaker.

One of the more overlooked factors in the sound of the guitar amplifier is the performance of the loudspeaker, and yet it is the probably the single most important contributor to the acceptable sound produced by an overdriven amplifier. All guitar amplifiers use one or more single element loudspeakers. Typical configurations are a single 12 inch, two 12 inch (sometimes in a stereo chorus format) and four 12 inch speakers in a "quad box". No commercially successful guitar amplifier has ever used a woofer-tweeter two-way speaker cabinet. There are good reasons for this fact.

The response of a typical 12 inch loudspeaker designed specifically for guitar amplifiers is shown in FIG. 1. The speaker was loaded in a cabinet with an open back and tested in an anechoic chamber at a distance of three meters away, using a commercial maximum length sequence measurement system and laboratory grade microphone. The response rolls off at low frequencies because the open backed cabinet allows cancellation of the front radiated sound by the back radiated sound. In the region of 1 kHz the first cone resonance occurs, and the response drops off noticeably, and then increases again to a peak at just above 2 kHz. The behaviour of the speaker when excited by a sinewave was examined using a small microphone placed close to the speaker diaphragm, in order to detect the local vibration of the speaker. As the input frequency approached 1 kHz the vibration at the periphery of the speaker, away from the voice coil, began to drop off, due to a lack of stiffness in the speaker cone. This reduced the radiated power considerably, creating the low output seen at above 1 kHz. At frequencies above this point, the speaker began to vibrate in a resonant mode with a circular antinode between the center and the rim, and the center and rim vibrations being out of phase. Since the rim vibrating area is large, the output is large in this frequency region. The radius of the antinode varied with the applied frequency.

At frequencies above 2 kHz the response drops to about 6 kHz, where it falls rapidly away. The modal behaviour of the diaphragm becomes complex at these frequencies, and little power is radiated in the far field.

Hence, the speaker behaves as a filter which rolls off the bass, puts a notch at around 1 kHz, and places a low pass filter at about 6 kHz.

The rapid attenuation of frequencies above 6 kHz is critical to the subjectively acceptable sound of the distorted guitar signal. The nonlinearities create a large amount of high frequency harmonic and intermodulation distortion, and this would be extremely unpleasant unless it was attenuated, whether using valve or solid state devices.

The notch at around 1 kHz is the other important feature of the speaker response. It removes the "mid rangy" sound of the guitar signal and creates a "thin" sound which has become recognised and preferred as the rock guitar tone.

All high quality preamplifiers that are designed to be plugged into a mixing desk or PA system contain speaker simulators which mimic the frequency responses of one or more speaker cabinets.

A further effect produced by a single loudspeaker is Doppler distortion. If a high frequency signal and a low frequency signal are radiated simultaneously, the high frequency signal is Doppler shifted by the low frequency. This effect is negligible in two or three way speakers, and some writers have claimed it is not noticeable in single speakers, but the high frequency, high amplitude distortion products produced by a guitar amplifier may be frequency modulated by the lower frequencies to the point where it affects the perceived sound.

Some amplifier manufactures make only valve products. Other manufacturers produce both valve and solid state amplifiers. The majority of amplifiers sold are solid state, because these can be made more cheaply, and with more reliable performance. Many manufacturers are increasingly looking for solid state alternatives which produce similar sound to the "valve paradigm". For example, Peavey Electronics Corp has released a line of amplifiers termed "Transtube™" which they claim reproduces the distortion characteristics of tube amplifiers—see European patent applications 95300062.7 and 95300126.0 on the Transtube technology, covering both valve preamp and valve power amplifier behaviour. Peavey have stated that valves will ultimately be unavailable and that viable alternatives must be found.

Another company, Deja Vu systems, has produced a tube emulator which uses solid state nonlinear circuitry to emulate the nonlinearity performance of the commonly used 12AX7 dual triode tube—see E. K. Pritchard, "The Tube Sound and Tube Emulators," dB Magazine, p 22–30, July/ August 1994 and U.S. Pat. Nos. 4,869,336, 4,995,084 and 5,113,014.

An alternative approach to creating the guitar sound is to develop a preamplifier that produces the same, similar, or superior subjective response without attempting to simulate the overload characteristics of preamplifier and power amplifier valves, and to use standard amplification and speaker systems to radiate the signal. There are disadvantages and advantages in this approach.

Disadvantages include:
  New distortion circuitry must be developed that is subjectively equivalent or superior to valve circuitry.
  Standard PA speaker systems vary widely in their level of fidelity. Many speaker cabinets have extremely non-flat responses, and colour any sound they radiate. The consistency of the guitar sound thus cannot be guaranteed unless specific speaker systems are recommended.

The advantage of the guitar speaker is that it is the final EQ stage in the signal chain, and cannot be subsequently coloured.

High fidelity two-way speakers are more expensive than the single radiator guitar speaker.

Power amplifier distortion must be avoided, since the PA speaker will not filter any distortion products it produces. Many modern amplifiers contain clipping avoidance circuitry which reduces this risk.

Advantages are:

The artist need only buy a new preamplifier when he/she desires a new sound

The directional radiation characteristics of a high fidelity speaker are superior to a guitar speaker system. A 12 inch speaker cannot radiate high frequencies over wide angles. For example, the −3 dB beamwidth of a 12 inch speaker at 4 kHz is around 16 degrees. If the speaker cabinet is on the floor, the on axis response is only obtained when the listener's ears are near floor level. The only solutions are:

a) the guitar speaker is raised on a stand and the guitarist stands in one playing position on-axis. This constrains the guitarist's position unduly.

b) A number of 12 inch speaker are used to create a wider near field radiation pattern. Many guitarists use a minimum of four speakers in a quad box, and most professional guitarists use a number of quad boxes. Interestingly, this technique does not in theory improve the radiation characteristics in the far field if the speakers are regularly spaced—it merely creates interference fringes (the array factor) in the original speaker radiation pattern. However, in practice the guitarist stands within the near field of the speaker array, and the radiation characteristics are an improvement over that of the single speaker.

A high fidelity two-way speaker system uses a tweeter to radiate the high frequencies, which has a much greater beamwidth at these frequencies. In this case the high fidelity approach is cheaper than the original approach if good radiation characteristics are required.

The preamplifier can be designed with a single nonlinear section that creates a subjectively desirable result. This is a great simplification over the original technology in which there are a myriad of nonlinearities occurring throughout the signal chain, and which make the design process complex.

One of the most important components of a guitar preamplifier is the distortion circuitry it employs. As stated above, many different devices have been used to create nonlinear transfer characteristics, but in all cases the goal is to create distortion that is not harsh, and which produce subjectively pleasing results when chords or intervals are played. These two subjective parameters are controlled by the harmonic and intermodulation products generated by the distortion circuit.

Control of harmonics: In general, any nonlinear circuit without memory has a voltage transfer characteristic $v_{out}=g(v_{in})$ that can be written as a power series $$g(V_{in}) = \sum_{n=1}^{\infty} a_n v_{in}^n$$

If a sinusoid of frequency fo is applied to the network, each $v_{in}^n$ term creates a harmonic nfo, plus other lower order terms. Hence the harmonic spectrum is governed by the coefficients in the power series. Transfer characteristics with sharp discontinuities will have a power series with large amplitudes of high order terms, creating considerable high frequency distortion products. Thus, the distortion properties are directly related to the smoothness of $g(v_{in})$. For guitar distortion, where the goal is to increase sustain and compress the dynamic range, $g(v_{in})$ has a compressive characteristic which has a large slope for $v_{in}=0$ and reduces to a small value for large positive or negative values of $v_{in}$. Smooth distortion characteristics are desirable for music such as rhythm and blues, whereas transfer curves with sharper transitions and flatter compression (very low derivatives for large $|v_{in}|$) are more desirable for rock music where higher harmonic content is required.

Control of intermodulation: Most circuits do not provide independent control of intermodulation. There are, however, two ways of achieving this.

If the guitar has a hexaphonic pickup, each string may be distorted separately, which produces no intermodulation between strings. However, the sound is musically uninteresting, and the output level is dependent on the number of strings played. By allowing controlled mixing of the separate string signals before the distortion circuits, the intermodulation can be controlled and the level made more constant. This technique requires a special pickup, and is therefore impractical in most cases.

The second method of controlling intermodulation is to use frequency dependent band splitting. The guitar signal is split into a number of separate frequency ranges, and each band is distorted separately, then the bands are recombined. If an input signal is applied which has several frequency components, some components will fall within one filter band, and others will fall within other bands. The distortion circuits will distort the filtered signals separately, producing lower levels of intermodulation products between them. The system is particularly effective for non harmonic inputs such as chords, where the intermodulation products are not harmonics of the fundamentals. This technique was described by C. Anderton in (see C. Anderton, "Fuzz and Filter Fun," Guitar Player Magazine p 120, June 1983), and he later published a four channel system termed the quadrafuzz (see C. Anderton, "Build the Superversatile Quadrafuzz—Four Fuzzes in One with Active EQ," Guitar Player Magazine, p 37–46, June 1984). The sound was claimed to have some of the characteristics of valve distortion.

However, any practical filter bank used of the band splitting operation will have finite attenuation verses frequency slopes in their out-of-band frequency regions. Hence for a sinusoidal input applied to an N-band system, all outputs will produce a finite amplitude sinusoid. This feature is in fact a desirable one, since the multiband distortion system is required to operate similarly for all input fundamental frequencies. Ideal filters would produce very different results depending on the fundamental frequencies applied.

The output of the barid splitting filters are fed to their respective distortion stages, where the signal is compressed and distorted. Since the input sinewave appears at all of the filter outputs, the distortion stages will tend to bring all of the input signals to the same amplitude at their outputs. Therefore, the waveform resulting from the addition of the outputs is strongly dependent on the phase of the input signals applied to the distortion stages. If the phases are not the same, the sum of the distorted signals will produce sharp transitions at the zero crossings of the signal. As an example, the output of a two channel system with a phase error of 30 degrees is shown in FIG. 2. The waveform resembles that due to crossover distortion, but the mechanism is different, and the subjective effect is undesirable.

SUMMARY OF INVENTION

The present invention provides an improved or at least alternative preamplifier system.

In broad terms the invention comprises a preamplifier system comprising:
- a filtering means for splitting an input signal into two or more separate frequency bands and comprising an identical phase response for each frequency band;
- two or more non-linear circuits, each of which distorts the input signal component of one of the frequency bands;
- a summing network for recombining said frequency bands.

In one form said filtering means comprises a cascade of N stages, each of which contains a low and a high pass filter to split the frequency band into two overlapping regions. Each output of the nth stage is fed to the (n+1)th stage, and is further split into two frequency ranges. The nth stage provides $2^n$ outputs, each covering a different frequency region. Each low pass and high pass filter pair of the nth stage is preceded by $(2^{n-1}-1)$ allpass filters to represent the phase characteristic of the other $2^{n-1}-1$ low pass & high pass filter pairs, such that the phase response of each stage is identical for each frequency band. In one digital implementation each digital lowpass and highpass filter may be obtained by a bilinear transformation of a corresponding lowpass and highpass analogue filter, and the allpass filters obtained by a bilinear transformation of a corresponding allpass analogue filter.

In another form said filtering means comprises a tree-structure cascade of N stage, wherein each stage contains a low and a high pass filter to split the frequency band into two overlapping regions. Either the low-pass or the high-pass output is fed to a subsequent bandsplitter, and the unsplit output is fed to an allpass filter which has the same phase response as the subsequent bandsplitter. The structure then continues in the same fashion. In this manner an N channel tree structure bandsplitter produces N+1 channels, and the nth stage requires n−1 allpass filter, such that the phase response of each stage is identical for each frequency band.

The filtering means in a digital system may utilise linear phase finite impulse response filters.

Further, said filtering means may comprise any combination of the above methods in order to produce any number of outputs all of which have the same phase at each frequency.

Preferably said cascade has two stages of two pole low and high pass filter pairs.

Preferably each low and high pass filter pair is a state variable filter.

Preferably the filtering means further comprises variable cross-mixing after one or more stages of said filtering means.

Preferably said preamplifier further comprises low pass filtering means after said non-linear circuits to reduce high frequency distortion products. Preferably said low pass filtering means is combined with said summing network such that in successive stages the lowest frequency band is low pass filtered with a low pass filter and the other frequency bands are all-pass filtered with an all-pass filter corresponding to said low-pass filter, said lowest frequency band is then combined with the next lowest frequency band; subsequent stages of filtering and combining are analogous to the first until all frequency bands are combined such that the phase response over all frequency bands through the low pass filtering and summing network is identical. Alternatively said low pass filtering means consists of lowpass filters for each channel which have different frequency responses and phases which are closely similar, as a suboptimal but low complexity method of reducing the high frequency distortion products.

Preferably the higher frequency bands non-linear circuits have a higher minimum gain than the lower frequency bands non-linear circuits.

Preferably also said non-linear circuits are variable.

BRIEF DESCRIPTION OF THE FIGURES

The invention is further described with reference to the accompanying figures which show preferred aspects and forms of the invention, by way of example and without intending to be limiting. In the figures.

DETAILED DESCRIPTION OF PREFERRED FORMS

The preamplifier system of the invention utilises the multiband distortion concept proposed by Anderton, together with extra linear filtering circuitry which controls the harmonic content and produces sounds reminiscent of—and in some ways superior to—the guitar amplifier sound. The processed guitar signal may be input directly to public address systems, recording consoles, or into standard guitar amplifiers and speakers.

Figure 3:
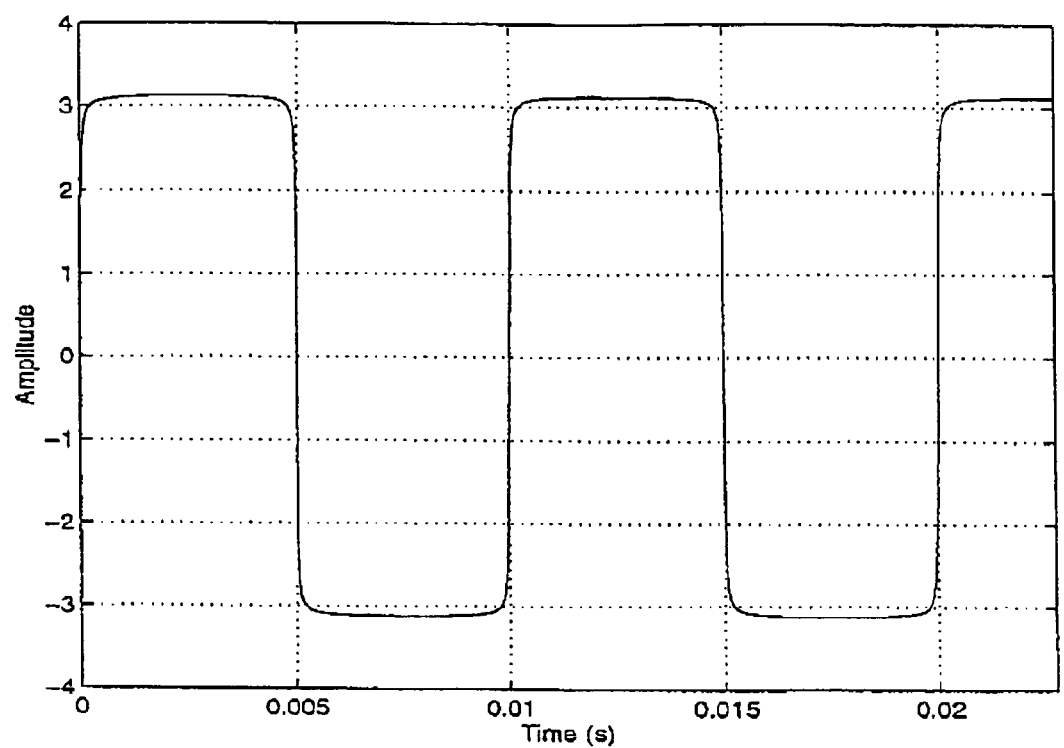
FIG. 3 is a plot similar to FIG. 2 but for a two channel distortion system with equiphase band splitting and 0 degrees phase error, for a sine wave input signal.

The system uses equiphase band splitting. With equiphase filtering, the multiband distortion system produces a sound that is judged to be superior to that of the system with non-equiphase filters, and which is considerably better sounding than standard solid state distortion circuits. In particular, two note intervals sounded better due to the reduction of intermodulation, and six note chords could be played with improved clarity. The output with zero phase error is shown in FIG. 3, and demonstrates no crossover-like artefacts.

Figure 4:
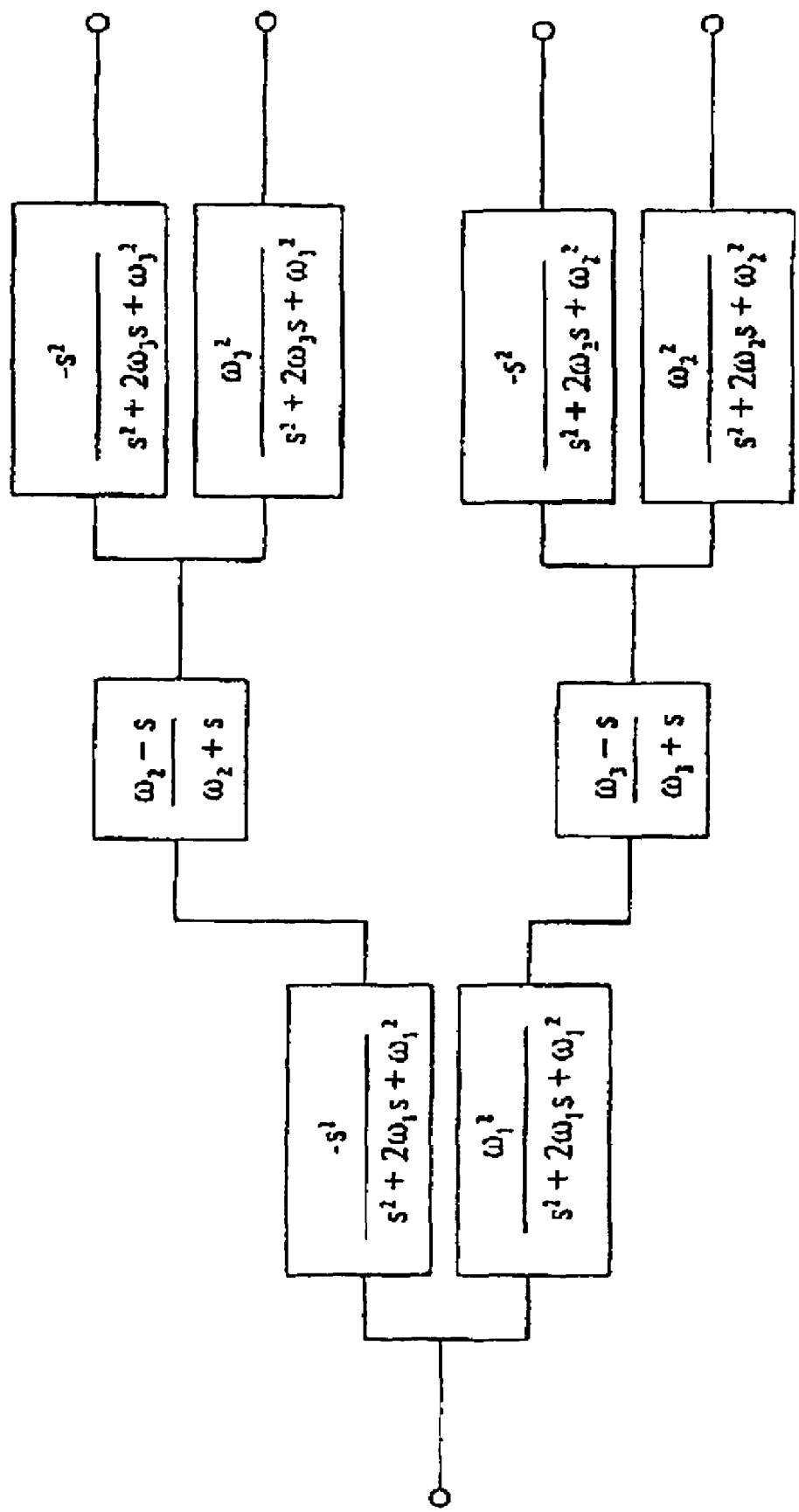
FIG. 4 is a block diagram of two pole, four band, equi-phase band splitter.

A particular embodiment of the equiphase band splitter is to use Linkwitz-Riley crossover networks (see S. H. Linkwitz, "Active Crossover Networks for Noncoincident Drivers," J. Audio Eng. Soc., vol. 24, no. 1, pp 2–8, January/February 1976). These networks use a cascade of pairs of 2n pole low and high pass filters to split the input signal into a number of bands. Since the filters have an even number of poles, allpass filters may be added to the later stages to maintain an equal phase response. A 2 pole, four band system is shown in FIG. 4 by way of example. For the 2 pole filters, the Q must be set equal to ½ in order to achieve the Linkwitz-Riley equi-phase criterion. The first stage splits the audio frequency range in two, and the second stages split each half of the range into two again. The upper stage has an additional allpass filter whose phase response equals that of the second band splitter in the lower stage, and the lower stage has an allpass filter to match the phase of the second band splitter in the upper stage. Thus the four outputs are equi-phase.

Figure 5:
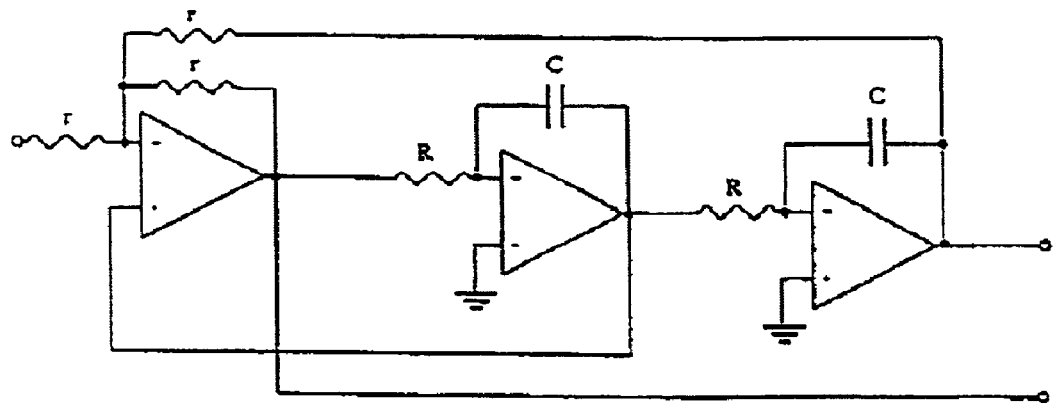
FIG. 5 shows a state variable implementation of a two pole Linkwitz Riley crossover network.

A particular embodiment of the highpass/lowpass filter pairs is to use a state variable filter, which ensures that the phase response of the two outputs is identical since they are derived from the same filter. FIG. 5 shows a state variable implementation to a two pole Linkwitz-Riley network. It requires three opamps instead of two, but uses two capacitors instead of four.

Figure 6:
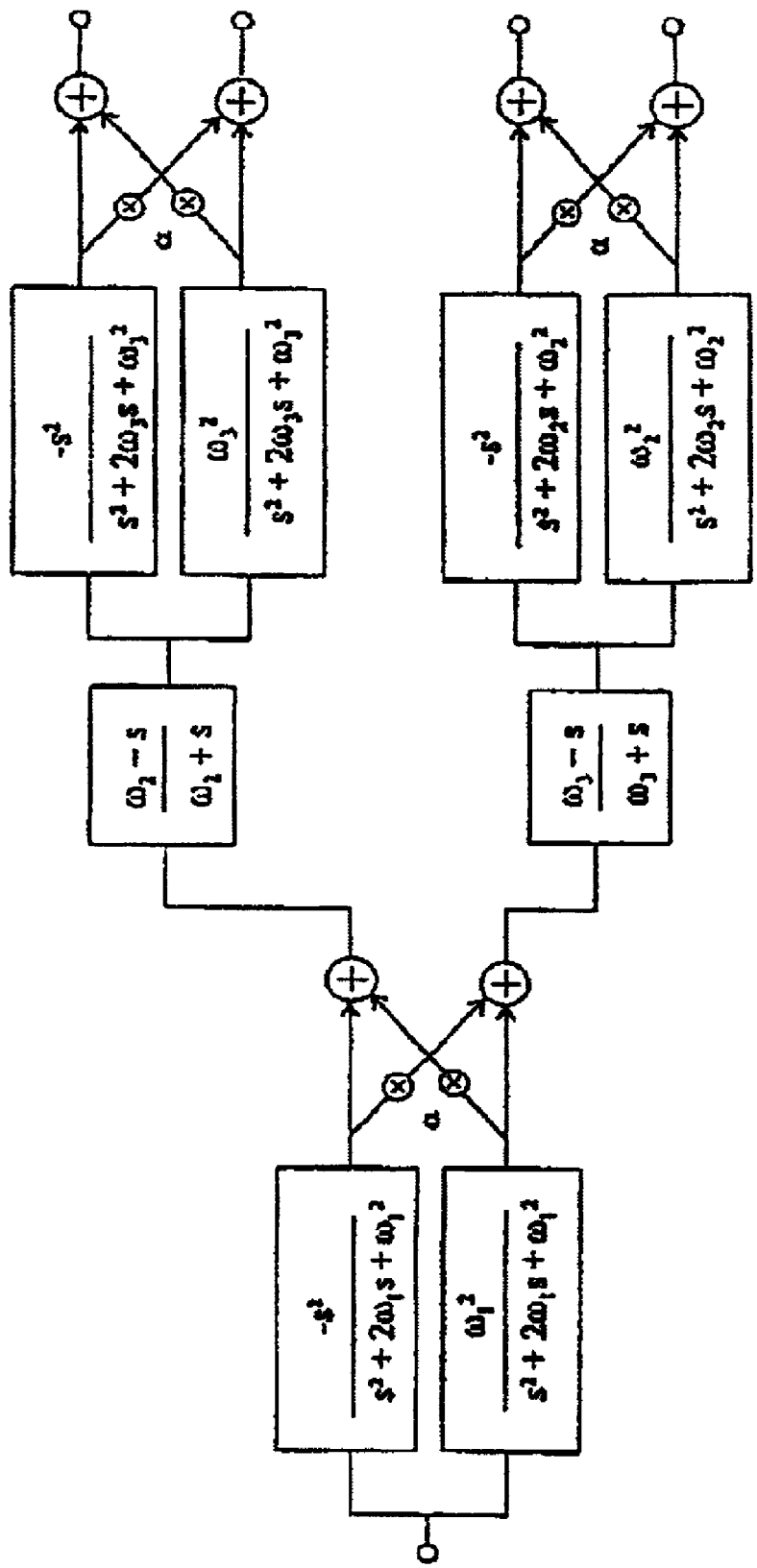
FIG. 6 shows a block diagram of a two pole, four band equi-phase band splitter with variable cross mixing.
Figure 7:
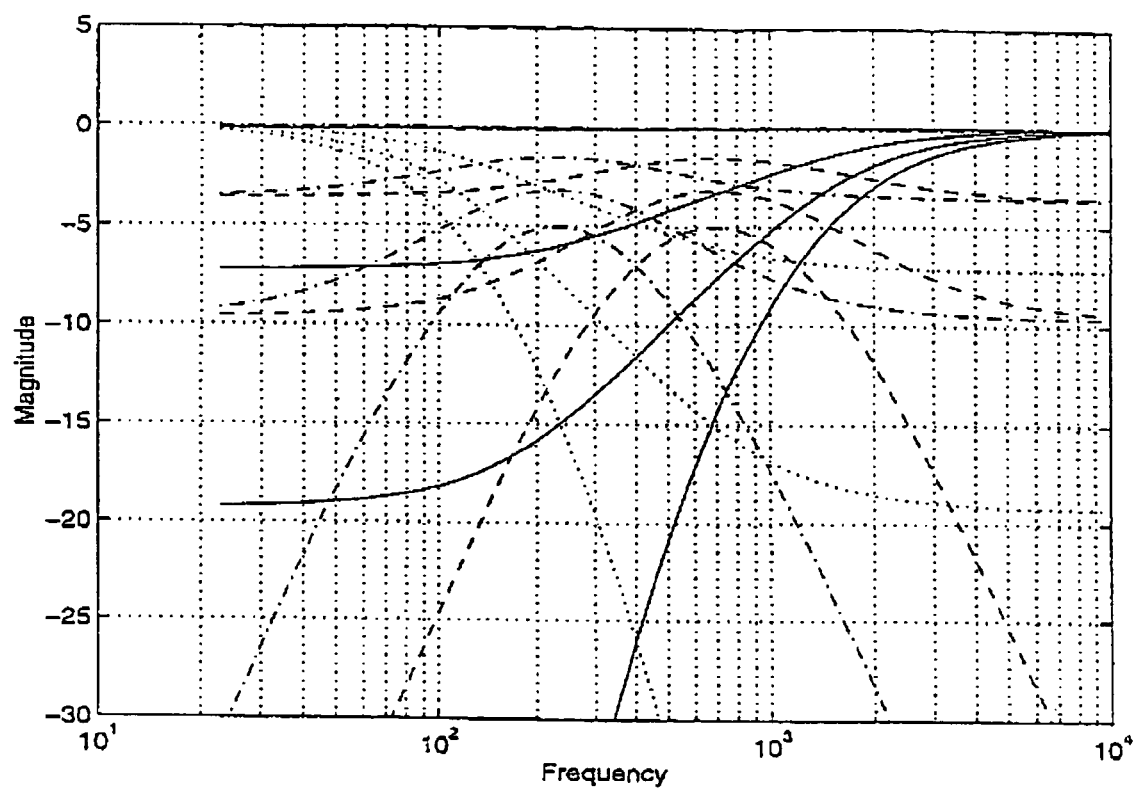
FIG. 7 shows frequency responses for a four band splitter with variable cross mixing.

A variable degree of mixing between the bands, which allows the intermodulation to be continuously controlled can be achieved using an N by N orthonormal cross coupling matrix after an N-band splitter. If the matrix is the identity matrix there is no cross coupling, and matrices with non-zero off-diagonal terms will provide cross coupling. However, this method is unwieldy, and requires $N^2$ multiply operations for N bands. A more efficient method is to implement a cross mixing function after each filter stage, as shown in FIG. 6, which shows a two pole, four band equi-phase band splitter with variable cross-mixing. By varying $\alpha$ the band splitting filters vary from a flat response for all frequencies ($\alpha=1$) to the unmixed filters ($\alpha=0$). For example the responses of a four band system are shown in FIG. 7 for four values of $\alpha$.

Figure 8:
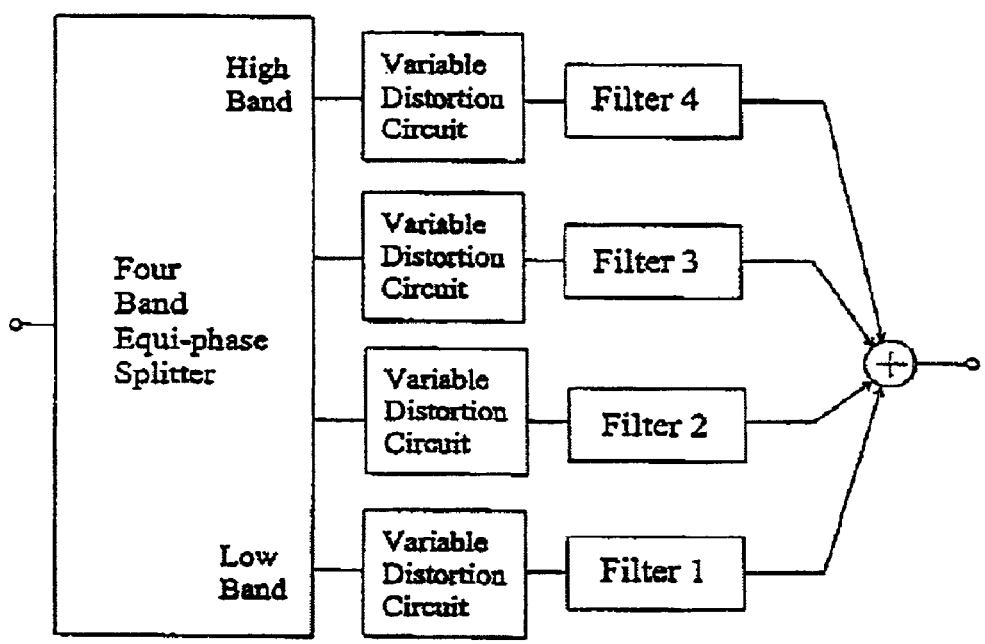
FIG. 8 shows a guitar distortion system consisting of four band equi-phase splitter, variable distortion stages, and band dependent low pass filters.

A further improvement can be made to the multi-band system by including low pass filters after each distortion stage to provide a reduction of high frequency distortion products that is related to the frequency range over which the channel operates. For example, the output of the lowest frequency stage will produce a large number of distortion products up to the limit of the speaker (or speaker simulator) bandlimit. The highest frequency channel will provide considerably less harmonics because it is operating much closer to the speaker bandlimit. The distortion of the low frequency channel signal produces an unpleasant buzzing sound which can be heard in the summed output. The inclusion of channel dependent low pass filtering eliminates this problem. FIG. 8 shows the inclusion of band dependent low pass filters following a four band equi-phase splitter and variable distortion stages.

Figure 9:
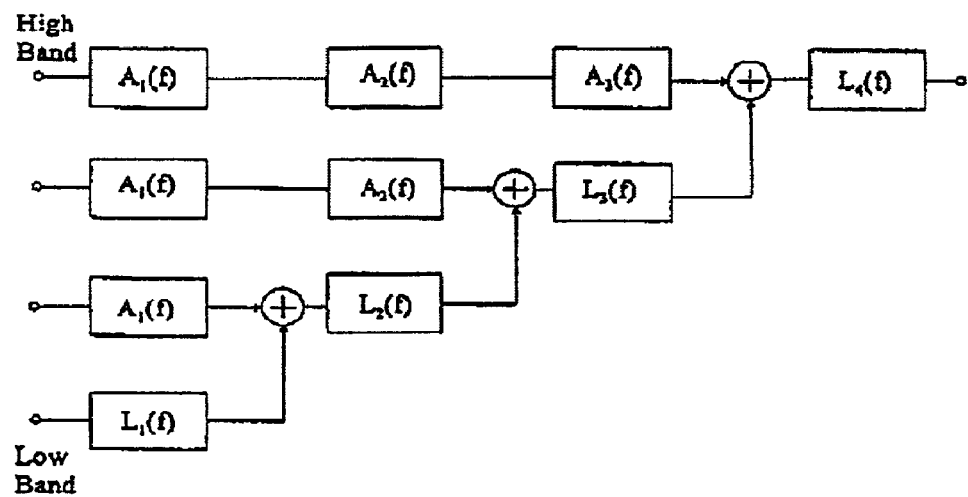
FIG. 9 shows an arrangement of equi-phase lowpass filters.

A further refinement to the channel dependent filtering is to ensure that the filters have equal phases. This may be carried out as shown in FIG. 9. The lowest frequency channel is low pass filtered, and the others have an allpass filter with the same phase response. The lowest channel may then be added to the next highest channel, and fed to the second channel filter, which filters the second channel, and adds some additional high frequency attenuation to the lowest channel. The procedure continues for the other channels. This uses the minimum number of allpass filters.

A further refinement to the distortion system concerns the adjustment of the minimum distortion gains. When the gain is low, less compression of the filtered signals occurs. A guitar signal produces large amplitudes of the fundamentals, with progressively less amplitudes of the higher harmonics of the fundamental. Hence, the output of the lowest frequency channel will distort more than the higher frequency channels. The subjective quality of the output is improved by ensuring that the minimum gain in the higher frequency channels is larger than that in the lower channels. Alternatively the system may provide different gains in each channel for a variety of musical effects.

Figure 10:
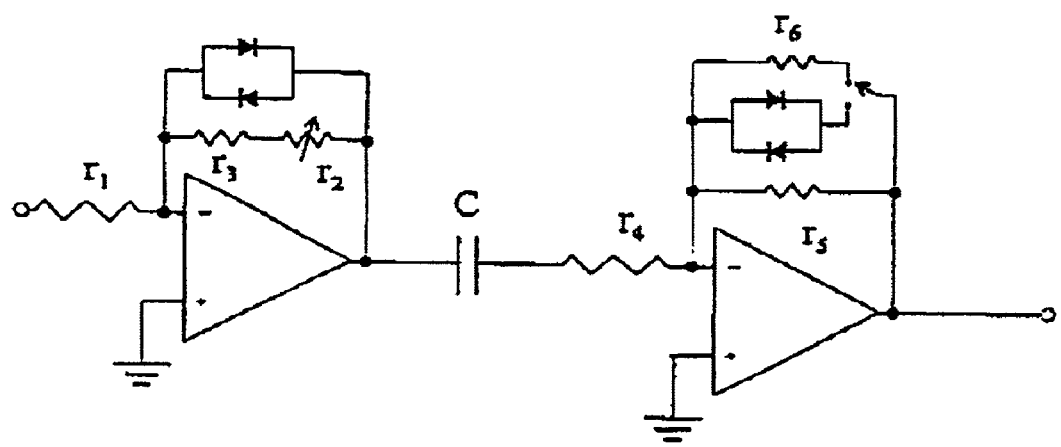
FIG. 10 shows an example of implementation of a two-mode Nonlinear transfer function.

An adjustable, or selectable distortion circuit that has two or more transfer characteristics may also be used in order to provide a variety of compressive characteristics suited for a variety of musical styles. FIG. 10 shows a simple example of implementation of a two-mode non-linear transfer function. Back to back diodes are placed in the feedback loop of an inverting op amp to provide an 's shape' compressive characteristic. This response is relatively smooth and has no sharp discontinuities. A second stage further compresses the transfer characteristic, creating a higher gain and a flatter compression of the signal. The second set of diodes may be switched as shown to allow selection of either characteristic. Resistor $r_3$ sets the minimum gain of the first stage and can be set to a different value for each band as described above.

Figure 1:
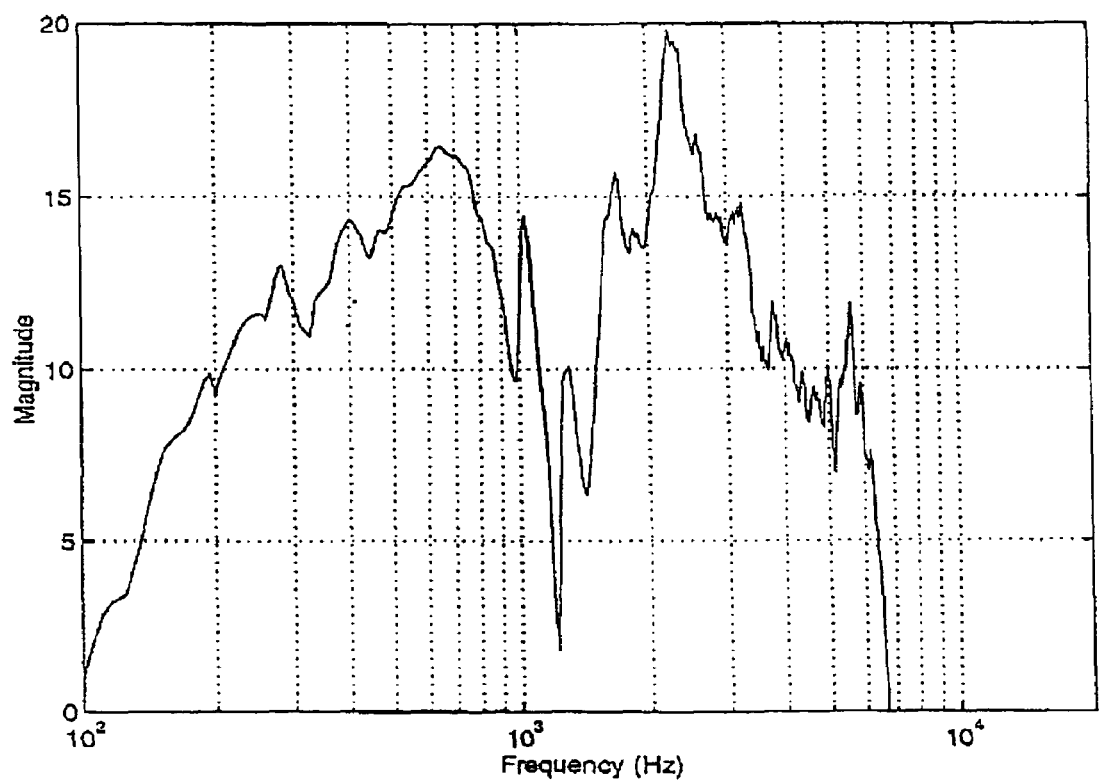
FIG. 1 is a frequency response curve for a 12 inch guitar speaker.
Figure 2:
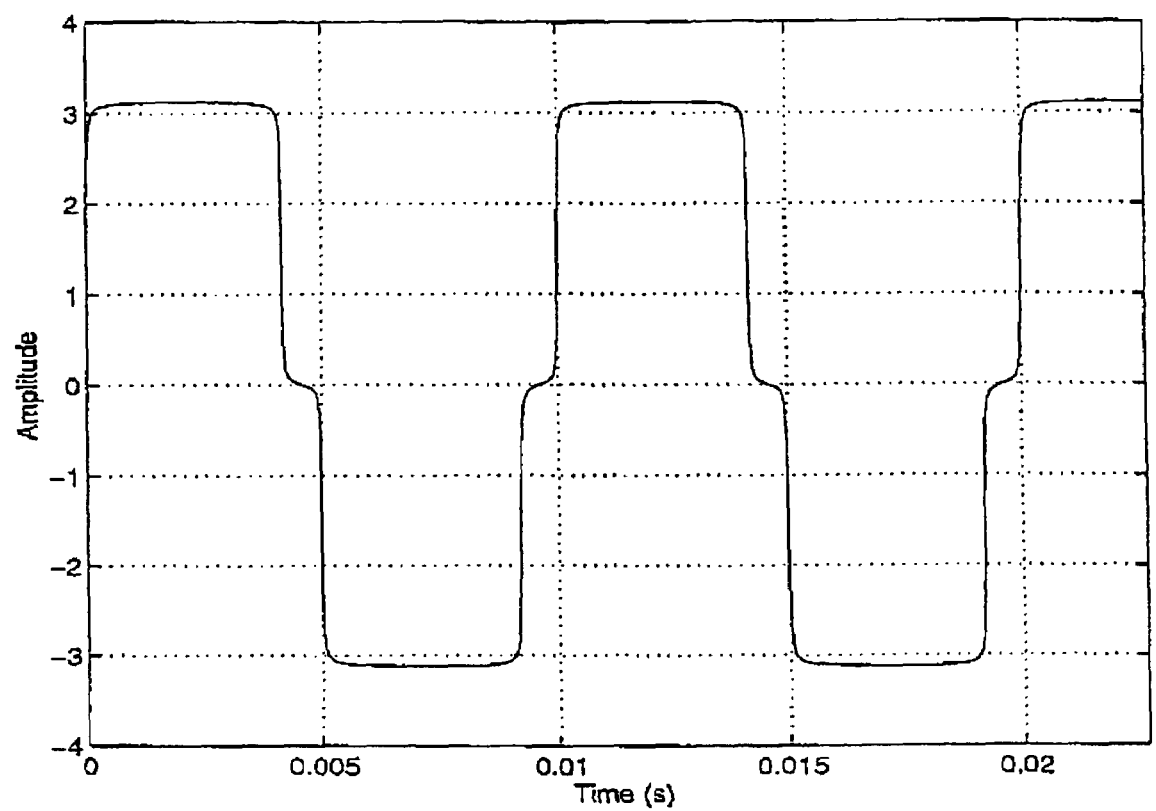
FIG. 2 is a plot of amplitude over time for the output of a two channel frequency dependent band splitting preamplifier system with 30 degrees phase error, for a sine wave input signal.
Figure 11A:
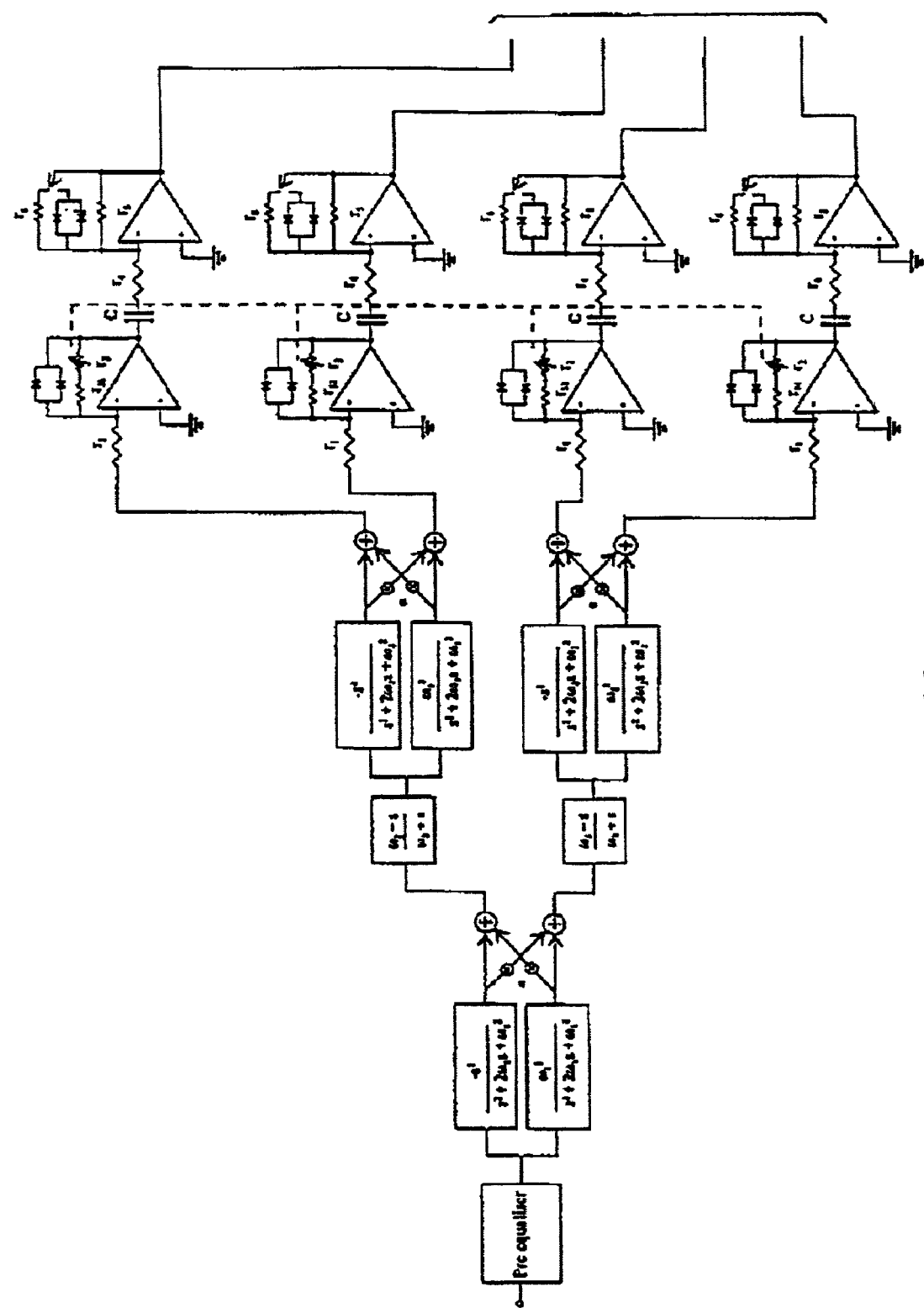
FIG. 11 shows a total preferred form guitar preamplifier system of the invention with controllable distortion.
Figure 11B:
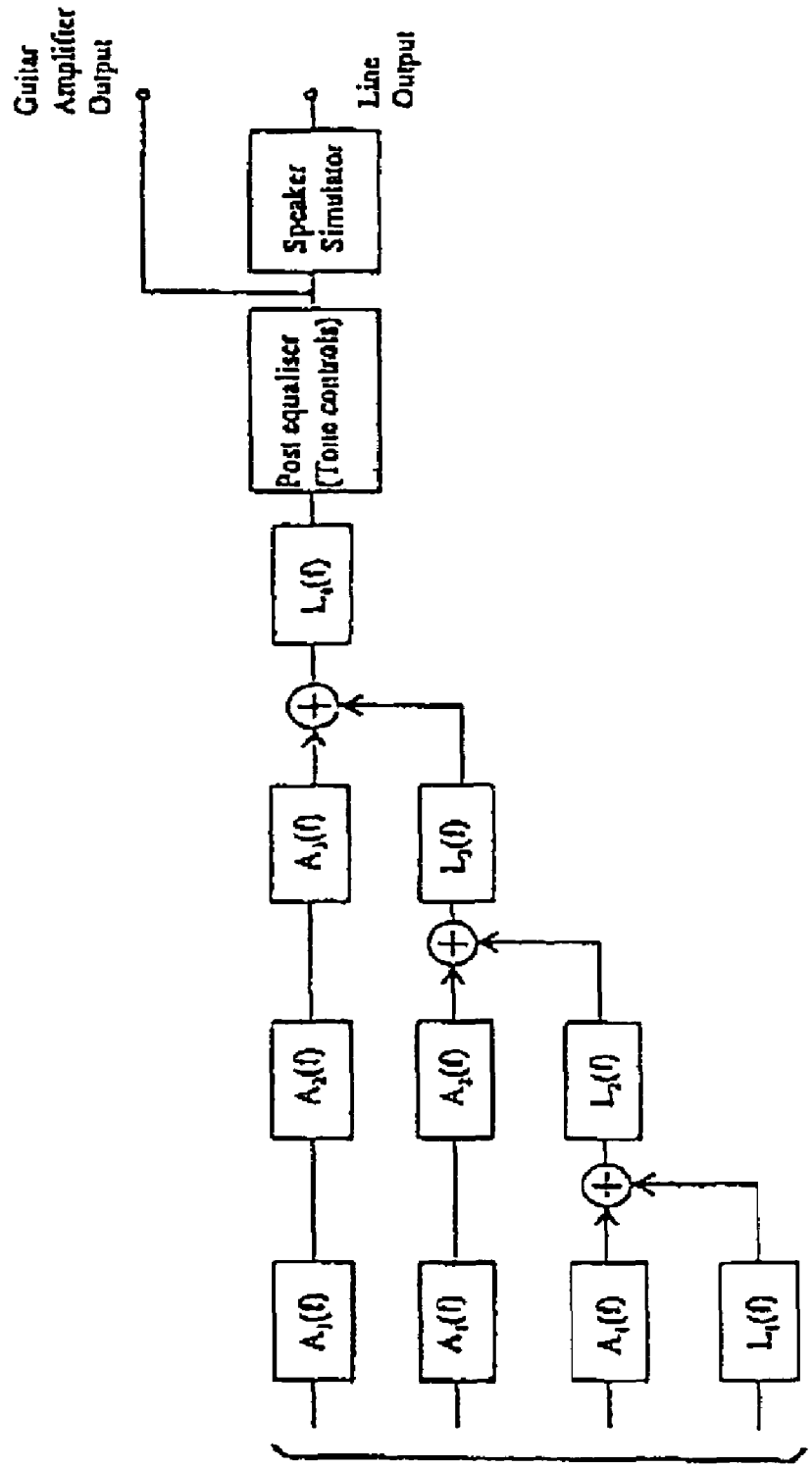

FIGS. 11a and 11b show a preferred form preamplifier system of the invention including all of the improvements described above. The instrument signal is input to a pre-equaliser which shapes the signal spectrum before the band-splitting and distortion stages. Often this is a treble boost circuit. Following the pre-equaliser is a 2 pole, 2-way band splitting filter of the form shown in FIG. 6 with cross coupling control parameter $\alpha$. The bandsplitter outputs are fed to a dual stage distortion circuit which provides one of two different nonlinear transfer characteristics. The first stage incorporates back to back diodes in the feedback loop of an operational amplifier to provide a transfer characteristic with a smooth transition from a linear response to a nonlinear compressed response. When the outputs of the second operational amplifiers are connected to $r_6$, the second stage acts as a linear inverter. When the switches are connected to the diodes, a further compression of the signal occurs, creating an overall transfer characteristic with a sharper transition to compression and a lower slope in the compressed region of the transfer characteristic. The distortion stage outputs are filtered by an equi-phase filtering and combining as depicted in FIG. 9. The combined signals are then fed to a post equaliser section which contains standard controls such as bass, middle, treble, contour, brite, and any other linear effects such as reverberation or chorus. Send and receive loops may also be incorporated at this point to allow further processing via external effects units. The signal at this point may be output to guitar amplifiers and their associated speakers, or fed into a speaker simulator which limits the high frequency response of the system according to one or more speaker response characteristics such as the one shown in FIG. 1, and then output at line level for feeding to mixing desks or sound reinforcement systems.

The foregoing describes the invention including a preferred form thereof. Alterations and modifications as will be obvious to those skilled in the art are intended to be incorporated within the scope hereof, as defined in the following claims.

The invention claimed is:

1. A guitar preamplifier, comprising:
   a) electronic filters including a first filter network, the network including:
      an input for receiving an input signal,
      a plurality of band splitter filters for producing a plurality of outputs from said input signal, wherein said plurality of band splitter filters split said input signal into a plurality of different, substantially equi-phase frequency bands in which frequency bands of substantially any frequency passed by more than one of said band splitter filters are substantially in phase in all of said bands;
   b) a plurality of non-linear circuits coupled to said plurality of outputs to distort respective output frequency bands; and
   c) a summing network coupled to said plurality of non-linear circuits to recombine said output frequency bands.

2. A musical instrument preamplifier system, comprising:
   a plurality of band splitter filters for splitting an input signal into a plurality of different, substantially equiphase frequency band output signals in which frequency bands of substantially any frequency passed by said plurality of band splitter filters are substantially in phase in all of said bands, and
   a plurality of non-linear circuits coupled to said plurality of band splitter filters to distort respective output frequency bands,
   wherein the plurality of band splitter filters include a cascade of a first filter network, and one or more subsequent filter networks, each network including:
      an input for receiving an input signal,
      a plurality of outputs for providing said substantially equi-phase frequency band output signals,
      wherein said plurality of band splitter filters split said input signal into a plurality of different frequency bands for the outputs,
      wherein for one or more of the subsequent networks, the input of each is coupled to one output of another network via a filter to provide substantially equiphase frequency bands on the network's output,
      and wherein outputs of some of the networks form frequency band outputs of the plurality of band splitter filters.

3. A guitar preamplifier according to claim 2, wherein said plurality of bandsplitter filters comprise a cascade of $2^N-1$ pairs of even-poled low and high pass filters arranged such that each pair splits the incoming frequency band in two, where N is the number of stages of pairs in the cascade, and wherein for the nth stage subsequent to the first, each low or high pass filter pair is preceded by $(2^{n-1}-1)$ all pass filters with phase response corresponding to the $(2^{n-1}-1)$ other low and high pass filter phase response in that stage such that the phase response of each stage is similar for each frequency band.

4. A guitar preamplifier according to claim 3, wherein said cascade has two stages of two pole low and high pass filter pairs.

5. A guitar preamplifier according to claim 2, wherein each low and high pass filter pair is a state variable filter.

6. A guitar preamplifier according to claim 3, wherein each low and high pass filter pair is a state variable filter.

7. A guitar preamplifier according to claim 2, wherein said plurality of bandsplitter filters further comprise variable cross-mixing after one or more stages of said filters.

8. A guitar preamplifier according to claim 7, wherein said plurality of bandsplitter filters further comprise variable cross-mixing after one or more stages of said filters.

9. A guitar preamplifier according to claim 7, further comprising low pass filters after said non-linear circuits to reduce high frequency distortion products.

10. A guitar preamplifier according to claim 9, wherein said bandsplitter filters are combined by said summing network such that in successive stages the lowest frequency band is low pass filtered with a low pass filter and the other frequency bands are all pass filtered with an all pass filter corresponding to said low pass filter, said lowest frequency band is then combined with the next lowest frequency band, and comprising subsequent stages of repeated filtering and combining until all frequency bands are combined, such that the phase response over all frequency bands through the low pass filtering and summing network is identical.

11. A guitar preamplifier according to claim 2, wherein said non linear circuit for each frequency band has a different gain than those in the other frequency bands.

12. A guitar preamplifier according to claim 2, wherein said non linear circuits for higher frequency bands have a higher minimum gain than the non-linear circuits for lower frequency bands.

13. A guitar preamplifier according to claim 2, wherein the distortion by said non-linear circuits is variable.

* * * * *